US012795967B2

(12) United States Patent
Lee et al.

(10) Patent No.: US 12,795,967 B2
(45) Date of Patent: Nov. 10, 2026

(54) METHOD OF MANUFACTURING FIELD-EFFECT TRANSISTOR ARRAY BY DIRECT CARBON NANOTUBE PRINTING AND FIELD EFFECT TRANSISTOR ARRAY MANUFACTURED BY THE SAME

(71) Applicant: DAEGU GYEONGBUK INSTITUTE OF SCIENCE AND TECHNOLOGY, Daegu (KR)

(72) Inventors: Yoonhee Lee, Seoul (KR); Hongki Kang, Daegu (KR); Soohyun Park, Daegu (KR); Minhye Shin, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 369 days.

(21) Appl. No.: 18/506,657

(22) Filed: Nov. 10, 2023

(65) Prior Publication Data

US 2024/0204078 A1 Jun. 20, 2024

(30) Foreign Application Priority Data

Dec. 14, 2022 (KR) ........................ 10-2022-0174404

(51) Int. Cl.
*H10D 30/01* (2025.01)
*H10D 30/43* (2025.01)
(Continued)

(52) U.S. Cl.
CPC ............. *H10D 30/01* (2025.01); *H10D 30/43* (2025.01); *H10D 62/121* (2025.01);
(Continued)

(58) Field of Classification Search
CPC ......... H10K 85/221–225; Y10S 977/742–752; C01B 32/158–178; C01B 2202/00–36;
(Continued)

(56) References Cited

U.S. PATENT DOCUMENTS

| | | | | |
|---|---|---|---|---|
| 10,921,314 | B2 | 2/2021 | Shepard et al. | |
| 2010/0263246 | A1 * | 10/2010 | Oh | H05K 3/02 427/64 |

(Continued)

FOREIGN PATENT DOCUMENTS

| | | | | |
|---|---|---|---|---|
| CN | 107293561 A | * 10/2017 | | H03K 3/0315 |
| CN | 112585454 A | 3/2021 | | |

(Continued)

OTHER PUBLICATIONS

Singh, R. S., Takagi, K., Aoki, T., Moon, J. H., Neo, Y., Iwata, F., Mimura, H., & Moraru, D. (2022). Precise Deposition of Carbon Nanotube Bundles by Inkjet-Printing on a CMOS-Compatible Platform. Materials, 15(14), 4935 (Year: 2022).*

(Continued)

*Primary Examiner* — Christine S. Kim
*Assistant Examiner* — Cole Leon Lindsey
(74) *Attorney, Agent, or Firm* — Sughrue Mion, PLLC

(57) ABSTRACT

The present disclosure relates to a method of manufacturing a field effect transistor array by direct carbon nanotube printing and a field effect transistor array manufactured by the same. In addition, the method of manufacturing a field effect transistor array according to the present disclosure can implement deposition by adjusting a concentration of carbon nanotubes at a desired location on a substrate without limiting the substrate and very easily control a location by printing carbon nanotubes at an electrode gap location, and since the carbon nanotubes do not contact oxides of the substrate, lower noise to implement excellent sensitivity. In (Continued)

addition, the method of manufacturing a field effect transistor array according to the present disclosure can significantly reduce manufacturing costs and processing time by printing carbon nanotubes at a desired location without additional processes, and can be applied to various devices through a low-temperature process.

16 Claims, 10 Drawing Sheets

(51) Int. Cl.
*H10D 62/10* (2025.01)
*H10D 62/83* (2025.01)
*H10D 84/83* (2025.01)
*H10P 14/20* (2026.01)
*H10P 14/26* (2026.01)

(52) U.S. Cl.
CPC ......... *H10D 62/8303* (2025.01); *H10D 84/83* (2025.01); *H10P 14/265* (2026.01); *H10P 14/3406* (2026.01)

(58) Field of Classification Search
CPC ..... H01J 2329/0455; H01J 2201/30434; H01J 2201/30469
See application file for complete search history.

(56) References Cited

U.S. PATENT DOCUMENTS

| | | | | |
|---|---|---|---|---|
| 2011/0315981 | A1* | 12/2011 | Xu | G01J 5/046 438/54 |
| 2019/0317084 | A1* | 10/2019 | Shepard | G01N 27/4146 |
| 2022/0364933 | A1* | 11/2022 | Kosaka | C01B 32/174 |

FOREIGN PATENT DOCUMENTS

| | | |
|---|---|---|
| KR | 10-1833135 B1 | 2/2018 |
| KR | 10-2024559 B1 | 9/2019 |

OTHER PUBLICATIONS

Rohitkumar Shailendra Singh, et al., "Precise Deposition of Carbon Nanotube Bundles by Inkjet-Printing on a CMOS-Compatible Platform", Materials, 2022, vol. 15, No. 4935, 1-9 (9 pages).
P. Beecher, et al., "Ink-jet printing of carbon nanotube thin film transistors", Journal of Applied Physics, 2007, vol. 102, 043710, 1-7 (8 pages total).
Jialuo Chen, et al., "Thin dielectric-layer-enabled low-voltage operation of fully printed flexible carbon nanotube thin-film transistors", Nanotechnology, 2020, vol. 31, 235301, pp. 1-10 (11 pages total).
Communication dated Feb. 20, 2024, issued in Korean Application No. 10-2022-0174404.

* cited by examiner

METHOD OF MANUFACTURING FIELD-EFFECT TRANSISTOR ARRAY BY DIRECT CARBON NANOTUBE PRINTING AND FIELD EFFECT TRANSISTOR ARRAY MANUFACTURED BY THE SAME

CROSS-REFERENCE TO RELATED APPLICATIONS

This application claims priority under 35 U.S.C. § 119 to Korean Patent Application No. 10-2022-0174404, filed on Dec. 14, 2022, in the Korean Intellectual Property Office, the disclosure of which is incorporated herein by reference in its entirety.

TECHNICAL FIELD

The following disclosure relates to manufacturing a field effect transistor array by direct carbon nanotube printing and a field effect transistor array manufactured by the same. More particularly, the present disclosure relates to a method of manufacturing a field effect transistor array in which source and drain electrodes are connected with carbon nanotubes by a direct printing method and a field effect transistor array manufactured by the same.

BACKGROUND

A bio-transistor directly converts molecular affinity into an electrical signal. The bio-transistor does not require optical labeling and achieves long-term molecular detection with excellent temporal resolution without optical instability. Bio-transistors constructed from carbon nanotubes providing excellent electrical properties at the nanoscale are needed for bio-electronic device fabrication, particularly those capitalizing on bio-molecular affinity.

In the manufacturing of the bio-transistor made of carbon nanotubes, the technology of arranging carbon nanotubes of uniform density in a micro-patterned electrode array is important. This is because carbon nanotube transistors with uniform performance may be produced on a large scale to lower manufacturing costs and achieve standardization of manufacturing technology.

In addition, carbon nanotube devices composed of carbon nanotube networks have a simple process and are easily compatible with large-area semiconductor processes. As the density of carbon nanotubes decreases, capacitance decreases and semiconductor characteristics increase, so the sensitivity of detecting field effect may be improved. Therefore, a technology for producing transistors with low-carbon nanotube density is also needed. In addition, when a single carbon nanotube may be aligned on an electrode in a desired location and direction, it is possible to produce uniform sensor arrays that maximize the electrical quality of the transistor.

Traditional manufacturing wafer-scale carbon nanotube transistors often employs techniques such as chemical vapor deposition, sedimentation, and interfacial self-assembly, etc. However, these methods have consistently presented challenges in regulating key factors such as the growth direction, length, position, arrangement, and density of carbon nanotubes on substrates. Furthermore, while the direct alignment method for nanowire-based field-effect transistors-disclosed in Korean Patent No. 10-1833135-stands out as a potentially effective strategy for the mass production of transistors, it introduces its own complications. This method requires additional steps, including surface coating and UV irradiation, which inherently complicate fabrication. Moreover, it has been observed that interactions between the carbon nanotubes and the substrate can induce electrical noise, further impeding the practicality of this approach.

Therefore, there is a demand for developing a manufacturing methodology that enables the production of sensitive field-effect transistor arrays characterized by uniformly spaced carbon nanotubes. Such a method should simplify the fabrication of single-channel transistors while significantly reducing noise levels.

RELATED ART DOCUMENT

Patent Document

Korean Patent Publication No. 10-1833135 (Feb. 21, 2018)

SUMMARY

An embodiment of the present invention is directed to manufacturing a field effect transistor array by carbon nanotube inkjet printing and a field effect transistor array manufactured by the same.

In one general aspect, a method of manufacturing a field effect transistor array includes: a) forming an insulating layer on a substrate and stacking a metal layer; b) patterning the stacked metal layer to form a plurality of source electrode and drain electrode pairs, c) jetting CNT ink between the plurality of source electrodes and drain electrodes, d) allowing the jetted CNT ink to spread along the source and drain electrodes in the form of a thin film.

In step b), the thickness of the metal electrode may be 10 to 200 nm.

A gap between the pair of source electrodes and drain electrodes formed in step b) may be 0.1 to 2 μm.

The CNT ink may be prepared by centrifuging a carbon nanotube dispersion obtained by sonicating a carbon nanotube film in a polar solvent and then extracting a supernatant.

The polar solvent may be a pyrrolidone-based solvent or water.

The pyrrolidone-based solvent may be any one selected from the group consisting of N-cyclohexyl-2-pyrrolidone (CHP), N-methyl pyrrolidone (NMP), and N-ethyl-2-pyrrolidone (NEP), or a mixture of two or more.

The length of carbon nanotubes included in the CNT ink may be 0.1 to 4 μm.

The CNT ink may include $1*10^{-6}$ to $1.5*10^{-5}$ wt % of carbon nanotubes based on the total weight of the ink.

The ultrasonication time may be 0.5 to 5 hours.

A jetting volume of the CNT ink in step c) may be 0.1 to 10 pl.

The contact angle of the CNT ink with respect to the electrodes is between 0 and 90 degrees in step d).

The differential in contact angles for the CNT ink between the substrate and the electrodes is between 5 and 60 degrees in step d).

The substrate may be 2 to 12 inches in diameter.

The substrate may include 20 to 50 chips.

The chip may include 50 to 100 pairs of source electrodes and drain electrodes.

The method may further include: before step c), performing oxygen plasma or UV ozone pretreatment on the substrate on which the source electrode and drain electrode are formed.

In another general aspect, there is provided a field effect transistor array manufactured by the above method of manufacturing a field effect transistor array.

The array may have 1 to 10 carbon nanotubes bridging the source and drain electrodes pair.

In another general aspect, a biosensor includes the field effect transistor array.

DETAILED DESCRIPTION OF EMBODIMENTS

Figure 1:
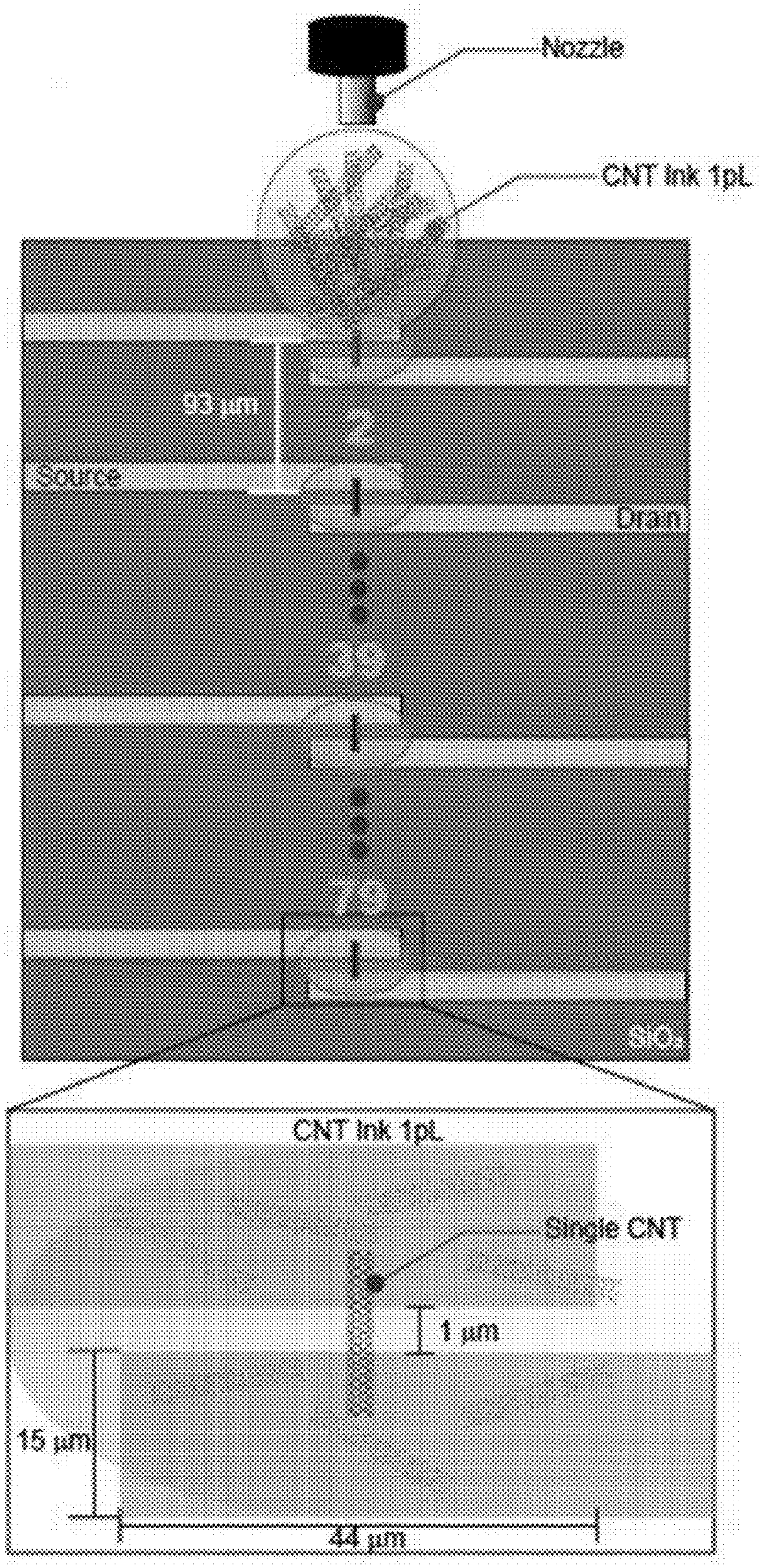
FIG. 1 is a schematic diagram of a field effect transistor array manufactured according to an example of the present disclosure.
Figure 2:
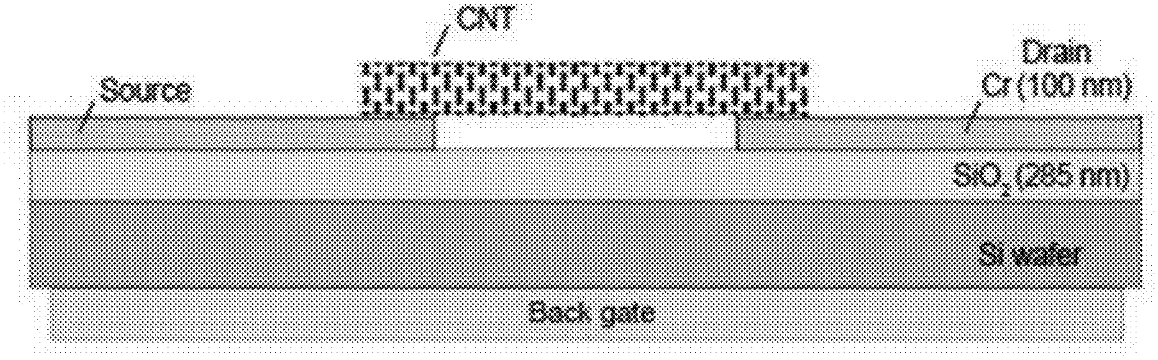
FIG. 2 is a schematic side view of the field effect transistor manufactured according to an example of the present disclosure.
Figure 3:
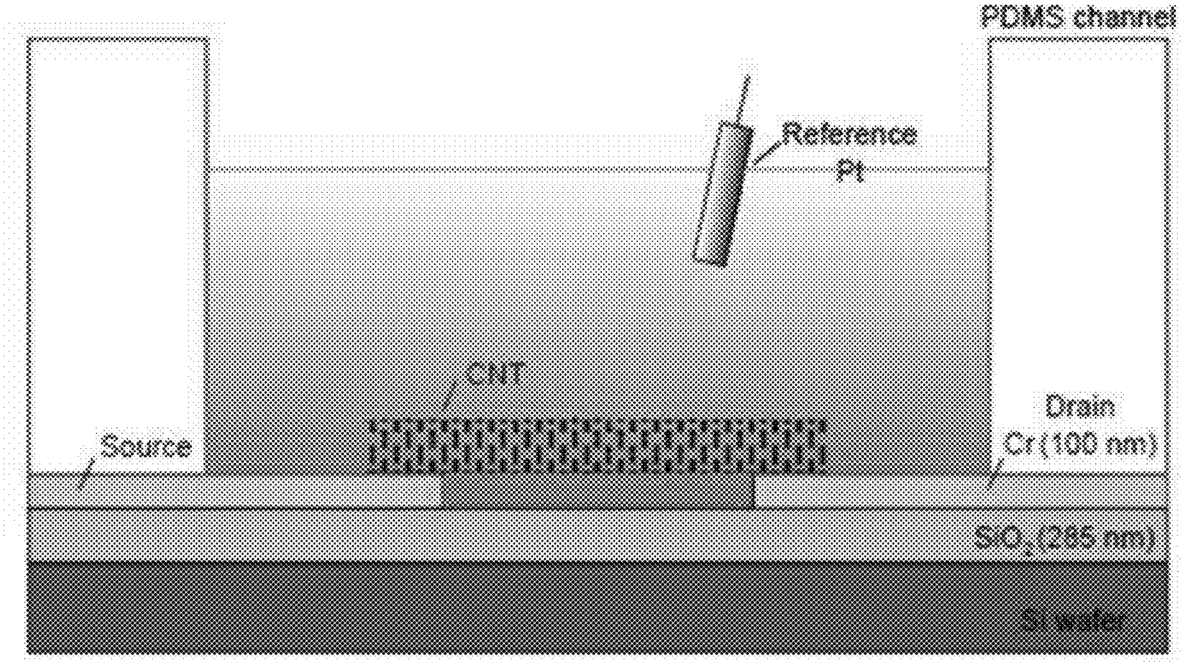
FIG. 3 is a schematic side view and an optical microscope image of a carbon nanotube transistor coupled with a microfluidic channel to measure a current in a liquid phase of the field effect transistor manufactured according to an example of the present disclosure.
Figure 3:
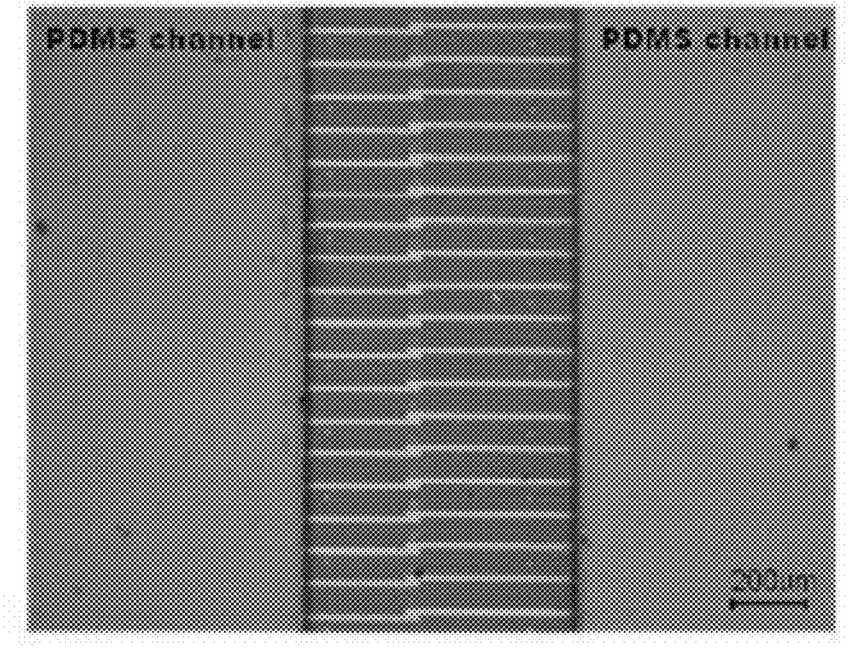
Figure 4:
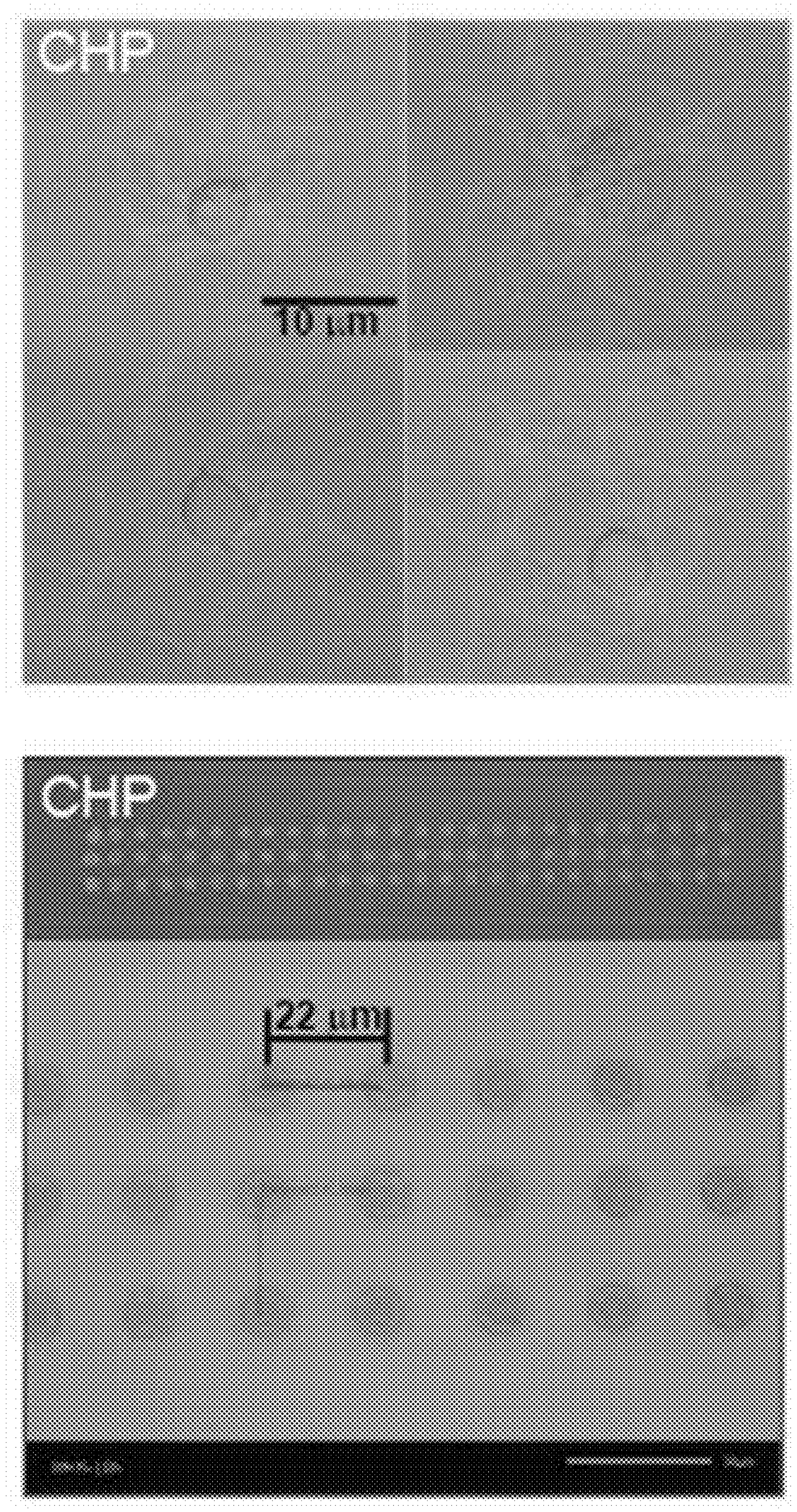
FIG. 4 is a scanning electron microscope image (top) after inkjetting CNT ink prepared with a CHP solvent according to an example of the present disclosure and a micrograph (bottom) after printing the ink.
Figure 5:
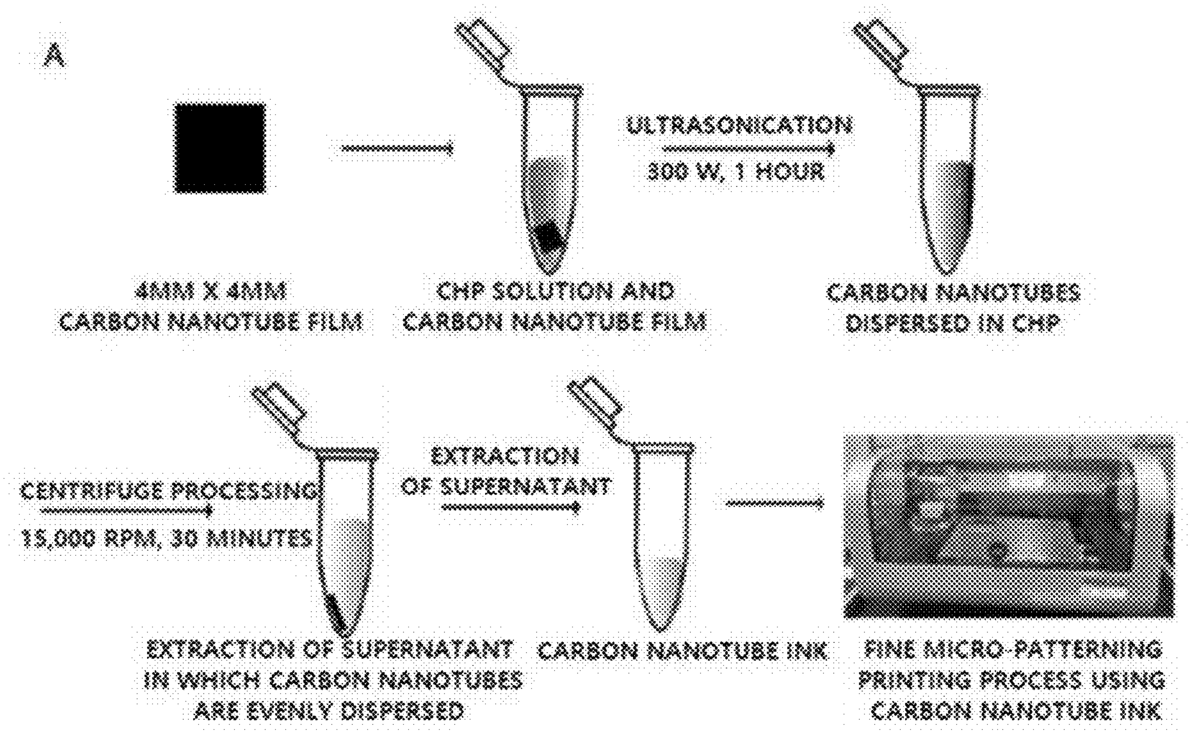
FIG. 5 is an image illustrating a process of preparing CNT ink according to an example of the present disclosure.
Figure 6:
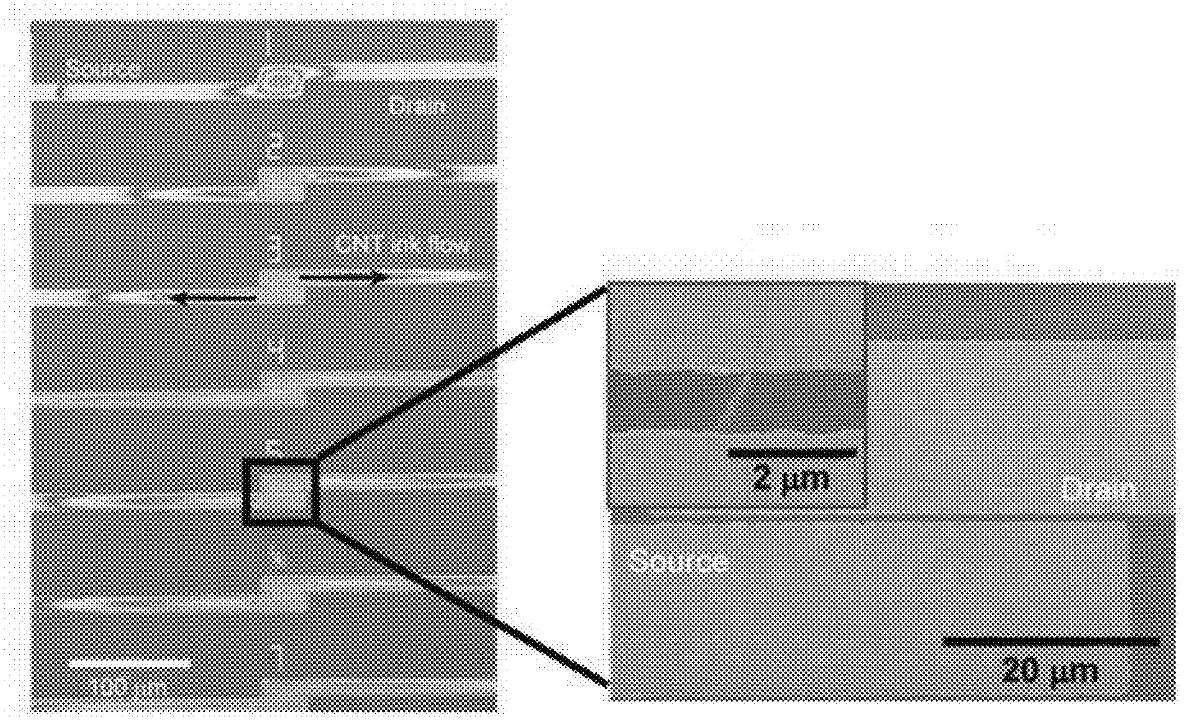
FIG. 6 is a photograph (left) of step d) of the method of manufacturing a field effect transistor array according to an example of the present disclosure and an electron micrograph (right) of carbon nanotubes printed between source and drain electrodes.
Figure 7:
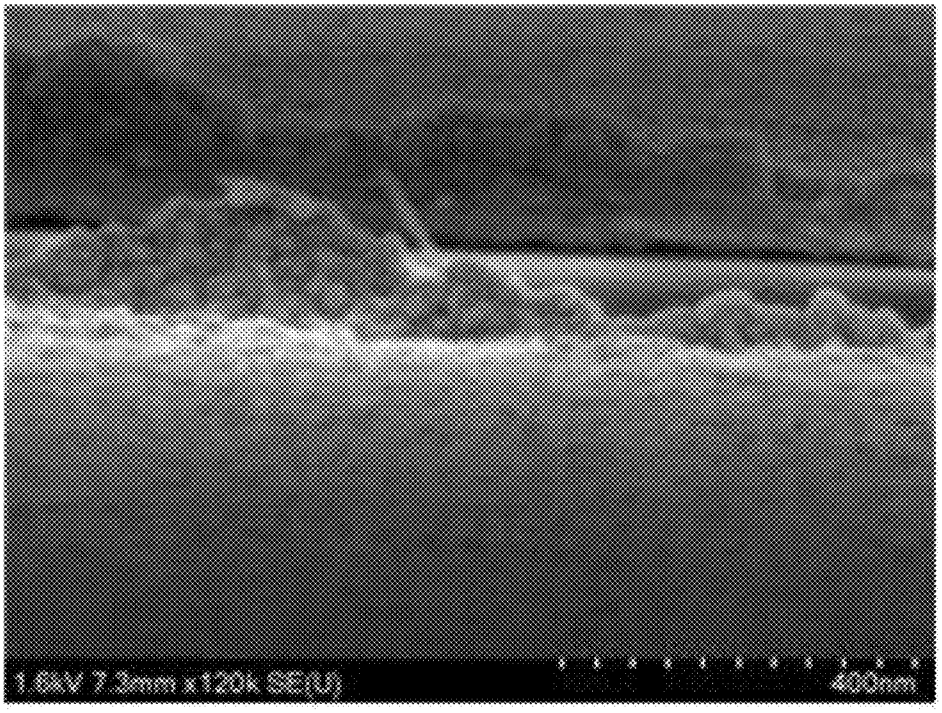
FIG. 7 is a scanning electron microscope image of a single carbon nanotube located between the source and drain electrodes of the field effect transistor manufactured according to an example of the present disclosure.

Technical terms and scientific terms used herein have the general meaning understood by those skilled in the art to which the present disclosure pertains unless otherwise defined, and a description for the known function and configuration unnecessarily obscuring the gist of the present disclosure will be omitted in the following description and the accompanying drawings.

Also, the singular forms used in the specification are intended to include the plural forms as well, unless the context specifically dictates otherwise.

In addition, unless specifically stated, units used in this specification are based on weight, and as an example, a unit of % or ratio means weight % or weight ratio, and unless otherwise defined, wt % means wt % of any one component in the composition out of the total composition.

In addition, numerical ranges as used herein include all possible combinations of lower and upper limits and all values within that range, increments logically derived from the form and width of the defined ranges, all values defined herein, and upper and lower limits of numerical ranges defined in different forms. Unless otherwise defined in the specification of the present disclosure, values out of a numerical range that may occur due to experimental errors or rounding of values are also included in the defined numerical range.

"Including" mentioned herein is an open-ended description having an equivalent meaning to expressions such as "comprising," "containing," "having," "characterizing," and elements, materials, or processes not listed additionally are not excluded.

The manufacturing method of a field-effect transistor array, as disclosed herein, offers precise control over the printing location and orientation of carbon nanotubes. This precision is achieved by pre-treating metal electrodes with oxygen plasma, among other techniques, and directly printing carbon nanotubes at the interstice between source and drain electrodes. This method may reduce device noise, a benefit derived from avoiding contact between the printed carbon nanotubes and the substrate. The process sequence outlined in this disclosure-encompassing electrode patterning, oxygen plasma pretreatment, and carbon nanotube (CNT) ink jetting-is synergistically integrated, enhancing the overall efficacy and practical application of the manufacturing method, thereby producing various electronic devices, including biosensors, as it facilitates the fabrication of transistor arrays with lower noise levels.

Hereinafter, the method of manufacturing a field effect transistor array by direct carbon nanotube printing and a field effect transistor array manufactured by the same will be described in detail.

The present disclosure includes the method of manufacturing a field effect transistor array including: a) forming an insulating layer on a substrate and depositing a metal layer; b) patterning the stacked metal layer to form a plurality of source electrode and drain electrode pairs; c) jetting CNT ink between the plurality of source electrodes and drain electrodes; and d) allowing the jetted CNT ink to spread along the source and drain electrodes in the form of a thin film.

First, step a) is a step of forming the insulating layer on the substrate and stacking the metal layer on the insulating layer.

In an example of the present disclosure, the substrate is not particularly limited as long as it is generally used in manufacturing the transistor, but specific examples may include silicon (Si) and silicon carbide (SiC) substrates, a gallium arsenide (GaAs) substrate, a flexible substrate, etc.

In an example of the present disclosure, the shape of the substrate is not particularly limited, but as a specific example, the shape of the substrate may be circular. When the substrate is circular, a diameter of the substrate may be 2 to 12 inches, and specifically 4 to 6 inches.

In an example of the present disclosure, the insulating layer may include an oxide selected from the group consisting of $SiO_2$, $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, and $SrTiO_3$, but is not limited thereto.

In an example of the present disclosure, a thickness of the insulating layer may be 200 to 500 nm and specifically 250 to 350 nm, but is not limited thereto.

In an example of the present disclosure, a material of the metal layer is not particularly limited and known electrode materials may be used. Specific examples thereof may include one or two or more selected from the group consisting of chromium (Cr), copper (Cu), molybdenum (Mo), aluminum (Al), aluminum alloy, tungsten (W), indium-tin oxide (ITO), doped silicon, gold, silver, nickel, palladium, platinum, tantalum, barium, calcium, and titanium.

In an example of the present disclosure, the thickness of the metal layer may be 10 to 200 nm and specifically 50 to 150 nm. When this is satisfied, noise generation due to interaction between the carbon nanotubes located on the metal layer and the substrate may be minimized, thereby improving the detection sensitivity of the device.

Next, step b) is a step of patterning the stacked metal layer to form a plurality of source electrode and drain electrode pairs.

In an example of the present disclosure, the patterning is not particularly limited and may be performed by the known patterning method. As specific examples, the patterning may be performed by forming a photolithography mask or a hard mask on the metal layer, exposing the metal layer to an etchant, or exposing the metal layer not covered by the mask to an etching gas.

In an example of the present disclosure, a gap between a pair of source electrodes and drain electrodes formed by the patterning may be 0.1 to 2 μm, and specifically 0.5 to 1.5 μm. When the range is satisfied, it is preferred because it is possible to improve the probability that the carbon nanotube may be located on the electrode pair.

In an example of the present disclosure, by the patterning, the substrate may include 20 to 50 chips, and specifically 30 to 40 chips. In addition, the chip may include 50 to 100 pairs of source electrodes and drain electrodes, and specifically 70 to 85 pairs. When the range is satisfied, it is preferred because it is possible to secure a high electrode integration density for mass production of devices, but is not necessarily limited thereto.

Next, step c) is a step of connecting the source electrode and the drain electrode with carbon nanotubes by printing CNT ink between the plurality of source electrodes and drain electrodes.

In an example of the present disclosure, the CNT ink may be prepared by centrifuging a carbon nanotube dispersion obtained by putting a carbon nanotube film in a polar solvent and ultrasonicating the carbon nanotube film, and then extracting a supernatant.

In an example of the present disclosure, the polar solvent is not particularly limited as long as it may exhibit hydrodynamic properties intended by the present disclosure, but specific examples may include a pyrrolidone-based solvent or water. In addition, in an example of the present disclosure, the pyrrolidone-based solvent may be any one selected from the group consisting of N-cyclohexyl-2-pyrrolidone (CHP), N-methylpyrrolidone (NMP), and N-ethyl-2-pyrrolidone (NEP), or a mixture of two or more. When this is satisfied, the carbon nanotubes in the CNT ink are evenly distributed radially without a coffee ring effect, so the overlapping phenomenon of ink droplets due to agglomeration of carbon nanotubes or low contact angle is significantly reduced, and the ink easily spreads along the electrode when the ink is printed, so it is preferred because the electrode pair has a high probability of being connected by a single carbon nanotube.

In an example of the present disclosure, the carbon nanotube film may include semiconducting single-wall carbon nanotubes (sc-SWCNT), but is not limited thereto.

In an example of the present disclosure, the ultrasonication may be performed for 10 to 300 minutes, and specifically, 30 to 120 minutes, and may be performed at an output of 100 to 1000 W, and specifically 200 to 500 W. When the range is satisfied, it is preferred because the carbon nanotubes included in the carbon nanotube film may be evenly dispersed in the polar solvent, but it is not limited thereto.

In an example of the present disclosure, a length of the carbon nanotubes may be 0.1 to 4 μm and specifically 0.5 to 2 μm, but is not limited thereto.

In an example of the present disclosure, the centrifugation may be performed at 5,000 to 30,000 rpm and specifically 10,000 to 20,000 rpm for 10 to 100 minutes and specifically 20 to 40 minutes, but is not limited thereto.

In an example of the present disclosure, the CNT ink may include $1*10^{-6}$ to $1.5*10^{-5}$ wt %, specifically $2*10^{-6}$ to $1*10^{-8}$ wt %, and more specifically $4*10^{-6}$ to $7*10^{-6}$ wt % of carbon nanotubes based on a total weight of ink. When the range is satisfied, the probability that the carbon nanotube is located between the source electrode and the drain electrode is high, so it is preferred because the device targeted by the present disclosure may be manufactured with excellent yield.

In an example of the present disclosure, the jetting of the CNT ink is not particularly limited and any known method may be used, and specifically, an inkjet printing method may be used.

In an example of the present disclosure, the jetting volume of the CNT ink may be 0.1 to 10 pl, specifically 0.5 to 5 pl, and more specifically 0.5 to 2 pl.

Next, step d) capitalizes on the differential surface tension between the substrate and the metal electrode, guiding the flow of CNT ink in a manner that promotes its spread into a uniform thin film. This phenomenon is preferred as the uniform dispersion of the carbon nanotubes may be achieved and one or more carbon nanotubes may connect the electrode pairs to each other. Meanwhile, the range may be for the volume of the CNT ink printed between the pairs of source and drain electrodes.

In one embodiment of the present disclosure, a contact angle between the CNT ink and the electrodes may be 0 to 90 degrees, specifically 5 to 50 degrees, and more specifically 10 and 25 degrees. Within this parameters, superwetting occurs on the electrode, allowing the ink to spread in the form of a thin film. Meanwhile "contact angle" may mean the angle between a liquid surface and a solid surface where they meet.

In another embodiment of the present disclosure, wherein the differential in contact angles for the CNT ink between the substrate and the electrodes may be between 5 and 60 degrees, specifically between 10 and 20 degrees. When these conditions are met, the ink can spread along the source and drain electrodes without flowing down onto the substrate. This is preferred as it increases the likelihood that one or more carbon nanotubes will connect between pairs of electrodes.

Expanding on the methodology, the present disclosure advocates an intermediate step prior to step c). This involves an oxygen plasma or UV ozone pretreatment on the substrate on which the source electrode and drain electrode are formed. Through the pretreatment, organic matters and moisture generated on the surface are removed, and an oxide film is formed to change the characteristics of both electrode and substrate surface. As a result, when the CNT ink is printed, the CNT ink may not flow down to the substrate due to a difference in surface wettability of ink for the substrate and the electrode and may spread along the source electrode and drain electrode, thereby increasing the chances of carbon nanotubes bridging on the electrode pairs.

In an example of the present disclosure, the oxygen plasma pretreatment may be performed at a power of 10 to 200 W, specifically 50 to 150 W, and more specifically 80 to 120 W for 30 to 200 seconds and specifically 80 to 150 seconds. When the range is satisfied, it is preferred because oxygen particles may be easily adsorbed on the pretreated portion and surface modification may be smoothly performed as an oxide film is formed on the surface of the substrate and electrode.

In an example of the present disclosure, the UV ozone pretreatment is not particularly limited as long as it is a UV lamp commonly used in the present technical field, but as a specific example, wavelengths of 185 nm and 253.7 nm are generated together, and irradiance may be performed through a UV lamp with a power of 5 to 50 mW/cm2 and specifically 10 to 20 mW/cm2. In addition, the UV ozone pretreatment may be performed for 5 to 30 minutes and specifically 10 to 20 minutes.

Meanwhile, the present disclosure provides a field effect transistor array manufactured by the method of manufacturing a field effect transistor array described above.

In an example of the present disclosure, in the field effect transistor array, the number of carbon nanotubes bridging the pair of source electrodes and drain electrodes may be 1 to 10, specifically 1 to 5, and more specifically 1 to 2.

By locating CNT ink directly onto the paired metal electrodes, the carbon nanotubes are positioned to minimize direct interaction with the substrate surface. This placement reduces device noise, an advancement that enhances the device's sensitivity. This strategic interaction, or lack thereof, between the carbon nanotubes and the substrate is pivotal, offering a pronounced improvement in the operational performance of the device, particularly in terms of sensitivity in detection applications In addition, as the CNT ink is printed after patterning the electrode layer, unnecessary additional processes are not required during the semiconductor process, and the risk of contaminants in the clean room process due to the carbon nanotubes is significantly reduced.

Furthermore, due to CNT's nanoscale dimensions akin to those of biomolecules and its superior electrical characteristics, the field effect transistor array is particularly suited for implementation as a biosensor. This applicability stems from its ability to detect various single molecules, leveraging its size compatibility and enhanced electrical interfacing with nanoscale biological elements.

Hereinafter, the method of manufacturing a field effect transistor array by direct carbon nanotube printing and the field effect transistor array manufactured by the same according to the present disclosure will be described in more detail through Examples and Comparative Examples. However, the following Examples are only one reference example for describing the present disclosure in detail, and the present disclosure is not limited thereto and may be implemented in various forms. In addition, unless otherwise defined, all technical and scientific terms have the same meaning as commonly understood by one of ordinary skill in the art to which this invention pertains. In addition, the terms used in the description of the present disclosure are for the purpose of effectively describing particular embodiments only and are not intended to limit the invention.

EXAMPLE

First, a $SiO_2$ insulating layer was formed to have a thickness of 285 nm on a 4-inch Si substrate, and then a metal layer made of chromium (Cr) was stacked to a thickness of 100 nm on the insulating layer.

Next, after 36 chips of 11 mm×10 mm size including 79 pairs of source and drain electrodes per chip were formed by patterning the stacked Cr metal layer, the substrate on which the source electrode and the drain electrode are formed was subjected to oxygen plasma pretreatment for 100 seconds with an output of 100 W using a plasma device (CUTE, FEMTO SCIENCE). In this case, a gap between a pair of source electrodes and drain electrodes was 1 μm.

Next, a carbon nanotube dispersion was obtained by putting a 4 mm×4 mm carbon nanotube film in a CHP solvent and ultrasonicating the carbon nanotube film at 300 W for 1 hour. After the dispersion was centrifuged at 15,000 rpm for 30 minutes, supernatant was extracted to prepare CNT ink containing $5*10^{-6}$ wt % of carbon nanotubes. In this case, the length distribution of the carbon nanotubes dispersed in the CNT ink was 0.5 to 2 μm. The field effect transistor array was manufactured by connecting two electrodes by jetting 1 pl of the CNT ink between all the source and drain electrodes on the substrate using the inkjet printing method and observing the number of carbon nanotubes connecting the electrode pairs. The results are shown in FIGS. 8 and 9.

COMPARATIVE EXAMPLE

Figure 9:
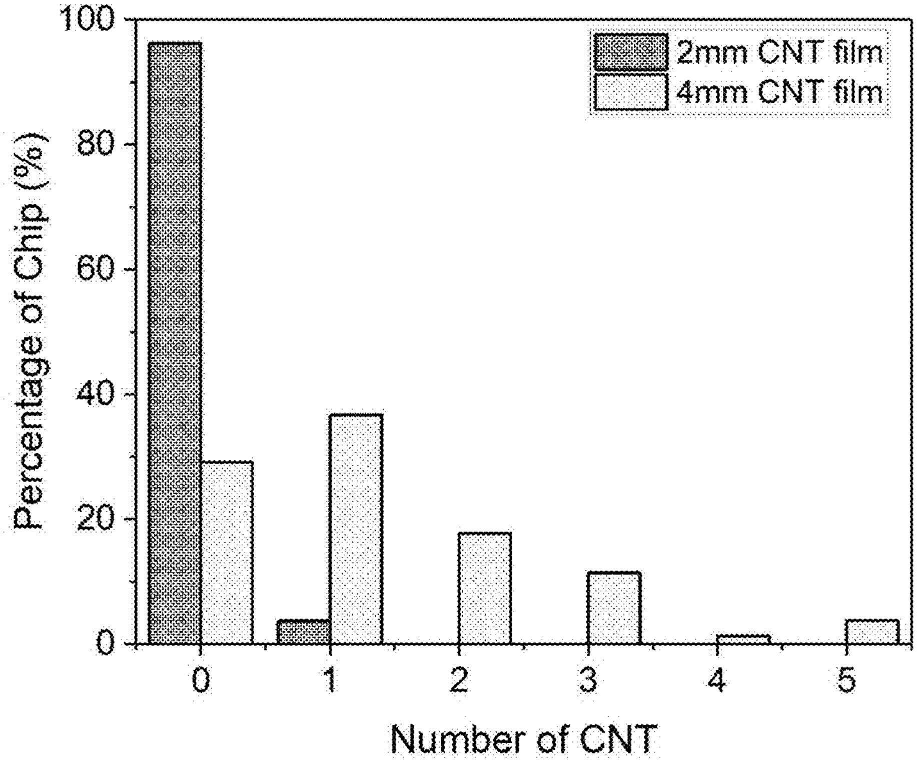
FIG. 9 is a graph showing a yield according to a carbon nanotube film size used in the CNT ink.

The same procedure as in Example 1 was performed except that a CNT ink containing $8*10^{-7}$ wt % of carbon nanotubes was prepared using a carbon nanotube film of 2 mm×2 mm, and the number of carbon nanotubes connecting the electrode pairs was observed and the results were shown in FIG. 9.

Figure 8:
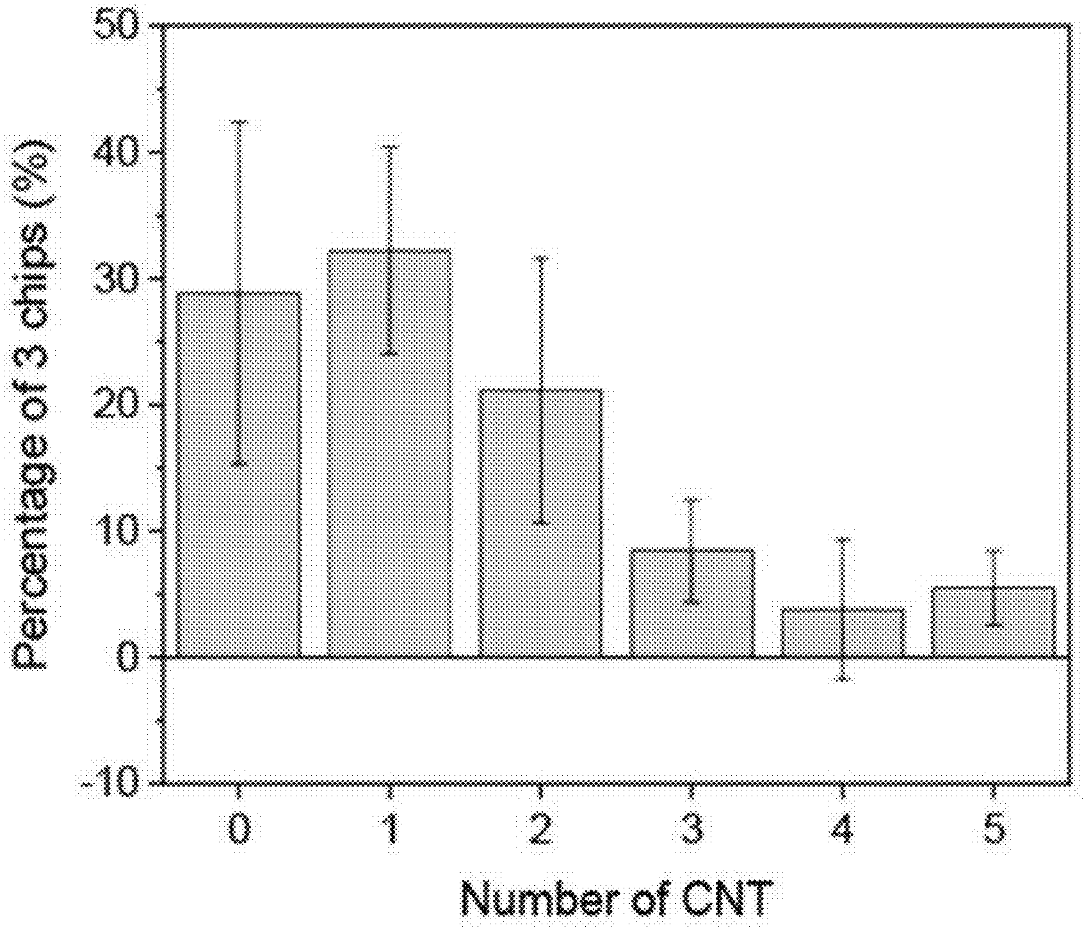
FIG. 8 is a graph showing the probability of the number of single carbon nanotubes connecting 237 electrode pairs in three chips in an array manufactured according to an example of the present disclosure.

According to FIGS. 8 and 9, in the case of Comparative Example, most carbon nanotubes connecting the electrode pairs were not present, but in the example, it was confirmed that carbon nanotubes connect the electrode pairs with a significantly high probability.

Figure 10:
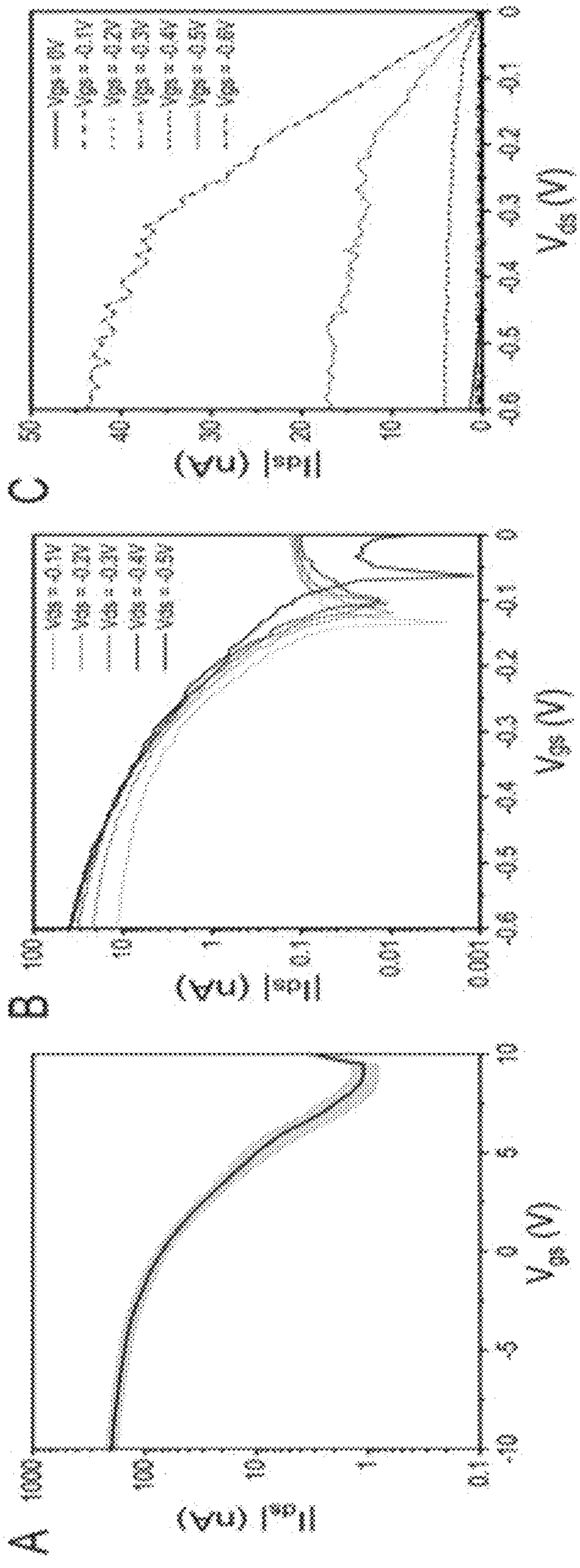
FIG. 10 shows diagrams illustrating a gate voltage ($V_{gs}$)—drain current (Ids) transfer curve measured in air, a gate voltage ($V_{gs}$)—drain current (Ids) transfer curve measured in the phosphate-buffered saline solution, and an output curve measured in the phosphate-buffered saline solution of the transistor manufactured according to an example of the present disclosure.

[Experimental Example] Performance Analysis of Field effect Transistor by Direct Carbon Nanotube Printing A of FIG. 10 illustrates a graph showing gate voltage ($V_{gs}$)—drain current (Ids) transfer characteristics of the field effect transistor manufactured according to Example 1 measured in air.

According to A of FIG. 10, the field effect transistor showed p-type semiconductor characteristics, and the Ion/Ioff ratio was 4.5×103, which showed uniform electrical characteristics.

B of FIG. 10 illustrates a graph showing the gate voltage ($V_{gs}$)—drain current (Ids) transfer characteristics of the field effect transistor manufactured according to Example 1 measured in a phosphate-buffered saline solution.

According to B of FIG. 10, it was confirmed that p-type semiconductor characteristics were maintained despite the change in the drain-source voltage (Vds), and the Ion/Ioff ratio was 8.5*103, which showed uniform electrical characteristics.

C of FIG. 10 illustrates an output curve of the field effect transistor manufactured according to Example 1 measured in the phosphate-buffered saline solution.

According to C of FIG. 10, a subthreshold swing was 0.265 V/dec, which showed that the transistor according to Example 1 has excellent power consumption.

The method of manufacturing a field effect transistor array according to the present disclosure can implement deposition by adjusting a concentration of carbon nanotubes at a desired location on a substrate without limiting the substrate.

In addition, the method of manufacturing a field effect transistor array according to the present disclosure can very easily control a location by printing carbon nanotubes at an electrode gap location, and since the carbon nanotubes do not contact oxides of the substrate, lower noise to implement excellent sensitivity.

In addition, the method of manufacturing a field effect transistor array according to the present disclosure can significantly reduce manufacturing costs and processing time by printing carbon nanotubes at a desired location without additional processes.

In addition, the method of manufacturing a field effect transistor array according to the present disclosure is implemented through a low-temperature process, and thus, can be applied to various devices.

Hereinabove, although the present disclosure has been described by specific matters and defined embodiments, they have been provided only for assisting in the entire understanding of the present disclosure. Therefore, the present disclosure is not limited to the exemplary embodiments. Various modifications and changes may be made by those skilled in the art to which the present disclosure pertains from this description.

Therefore, the spirit of the present disclosure should not be limited to these exemplary embodiments, but the claims and all of modifications equal or equivalent to the claims are intended to fall within the scope and spirit of the present disclosure.

What is claimed is:

1. A method of manufacturing a field effect transistor array, comprising:

a) forming an insulating layer on a substrate and stacking a metal layer;

b) patterning the stacked metal layer to form a plurality of source electrode and drain electrode pairs;

c) jetting CNT ink between the plurality of source electrodes and drain electrodes; and d) allowing the jetted CNT ink to spread along the source and drain electrodes in the form of a thin film;

wherein in step c), the CNT ink is jetted at a single point within an overlapping region of each source electrode and drain electrode pair, and the CNT ink flows from the jetted point along patterns of the source electrode and the drain electrode in opposite directions to each other, thereby positioning carbon nanotubes within the overlapping region to connect the source electrode and the drain electrode with the carbon nanotubes, wherein the method further comprises, before step c), performing oxygen plasma or UV ozone pretreatment on the substrate on which the source electrode and drain electrode are formed to induce a difference in surface wettability of the ink with respect to the substrate and the electrodes, wherein the CNT ink includes 1*10-6 to 1.5*10-5 wt % of carbon nanotubes based on a total weight of the ink, and wherein the jetting in step c) comprises dropping the CNT ink in a volume ranging from 0.1 to 10 pl onto a point in an overlapping region of the source electrode and the drain electrode.

2. The method of claim 1, wherein in step b), a thickness of each of the plurality of source electrode and drain electrode pairs is 10 to 200 nm.

3. The method of claim 1, wherein a gap between the pair of source electrodes and drain electrodes formed in step b) is 0.1 to 2 μm.

4. The method of claim 1, wherein the CNT ink is prepared by centrifuging a carbon nanotube dispersion obtained by putting a carbon nanotube film in a polar solvent and ultrasonicating the carbon nanotube film, and then extracting a supernatant.

5. The method of claim 4, wherein the polar solvent is a pyrrolidone-based solvent or water.

6. The method of claim 5, wherein the pyrrolidone-based solvent is any one selected from the group consisting of N-cyclohexyl-2-pyrrolidone (CHP), N-methylpyrrolidone (NMP), and N-ethyl-2-pyrrolidone (NEP), or a mixture of two or more.

7. The method of claim 1, wherein a length of carbon nanotubes included in the CNT ink is 0.1 to 4 μm.

8. The method of claim 4, wherein the ultrasonication time is 0.5 to 5 hours.

9. The method of claim 1, wherein the substrate is 2 to 12 inches in diameter.

10. The method of claim 1, wherein the substrate includes 20 to 50 chips.

11. The method of claim 10, wherein the chip includes 50 to 100 pairs of source electrodes and drain electrodes.

12. The method of claim 1, in step d), wherein the contact angle of the CNT ink with respect to the electrodes is between 0 and 90 degrees.

13. The method of claim 1, in step d), wherein the differential in contact angles for the CNT ink between the substrate and the electrodes is between 5 and 60 degrees.

14. A field effect transistor array manufactured by the manufacturing method of claim 1.

15. The field effect transistor array of claim 14, wherein the array has 1 to 10 carbon nanotubes connecting the pair of source electrodes and drain electrodes.

16. A biosensor comprising the field effect transistor array of claim 14.

* * * * *